(12) United States Patent
Lee

(10) Patent No.: US 6,803,259 B2
(45) Date of Patent: Oct. 12, 2004

(54) SILICON CONTROLLED RECTIFIER FOR SIGE PROCESS, MANUFACTURING METHOD THEREOF AND INTEGRATED CIRCUIT INCLUDING THE SAME

(75) Inventor: Jian-Hsing Lee, Pu-Tzu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 31 days.

(21) Appl. No.: 10/404,620

(22) Filed: Mar. 31, 2003

(65) Prior Publication Data

US 2004/0067609 A1 Apr. 8, 2004

(30) Foreign Application Priority Data

Oct. 7, 2002 (TW) ........................................ 91123105 A

(51) Int. Cl.[7] ........................ H01L 21/332; H01L 29/74
(52) U.S. Cl. ........................ 438/133; 438/309; 438/312; 438/318; 438/325; 438/350; 438/353; 438/359; 438/362; 257/107; 257/173; 257/342
(58) Field of Search ................................ 438/133, 309, 438/312, 318, 325, 350, 353, 359, 362; 257/107, 173, 342

(56) References Cited

U.S. PATENT DOCUMENTS

| 6,239,463 | B1 | * | 5/2001 | Williams et al. | ............ 257/328 |
| 6,576,974 | B1 | * | 6/2003 | Chang et al. | ............... 257/499 |
| 6,586,818 | B1 | * | 7/2003 | Voldman | ..................... 257/587 |
| 2002/0153571 | A1 | * | 10/2002 | Mergens et al. | ............ 257/358 |
| 2003/0047750 | A1 | * | 3/2003 | Russ et al. | .................. 257/173 |
| 2004/0110353 | A1 | * | 6/2004 | Mallikarjunaswamy | ..... 438/309 |

OTHER PUBLICATIONS

S. Voldman et al., Electrostatic Discharge Characterization of Epitaxial–Base Silicon–Germanium Hetrojunction Bipolar Transistors, EOS/ESD Symposium 2000, pp 3A1.1–3A1.12.*

"BSCR Device Structure" SCR for BICMOS IEDM 1995 p. 337.

* cited by examiner

Primary Examiner—Matthew Smith
Assistant Examiner—B. V. Keshavan
(74) Attorney, Agent, or Firm—Thomas, Kayden, Horstemeyer & Risley

(57) ABSTRACT

A silicon controlled rectifier for SiGe process. The silicon controlled rectifier comprises a substrate, a buried layer of a first conductivity type in the substrate, a well of the first conductivity type in the substrate and above the buried layer, a doped region of a second conductivity type in the well, a first conducting layer of the second conductivity type on the substrate, and a second conducting layer of the first conductivity type on the first conducting layer.

25 Claims, 8 Drawing Sheets

SILICON CONTROLLED RECTIFIER FOR SIGE PROCESS, MANUFACTURING METHOD THEREOF AND INTEGRATED CIRCUIT INCLUDING THE SAME

BACKGROUND OF THE INVENTION

1. Field of the Invention

The present invention relates to a silicon controlled rectifier, and particularly to a silicon controlled rectifier for SiGe process and a manufacturing method thereof.

2. Description of the Prior Art:

Over the past decade, the semiconductor technologies used in communications systems have been undergoing something of a forced divergence—between the high-integration capabilities of silicon-based processes and the high-performance possibilities of exotic processes like gallium arsenide (GaAs). Largely because of the inherent disparities between these processes, it even appeared that communications-oriented semiconductors might be finally approaching their practical limits in terms of both size reduction and performance improvement. For many applications, low-cost, high-volume silicon processes have been successfully used throughout the 1 to 2 GHz frequency domain, however for new RF applications that require much higher speed circuit operation, such as 30 GHz, standard silicon processes fall far short. On the other hand, compound III–V semiconductors such as GaAs, have been successfully implemented in these ranges, however at significant additional expense due to their exotic process requirements.

As a cost-driven market arena that intrinsically requires both performance and a high level of integration, the next generation of mobile wireless devices was literally dependent upon finding a cost-effective way to re-converge these capabilities into a unified semiconductor process. Many industry experts believe that the answer has now arrived in the form of Silicon Germanium (SiGe) process technologies.

Significant growth in both high-frequency wired and wireless markets has introduced new opportunities where compound semiconductors have unique advantages over bulk complementary metal oxide semiconductor (CMOS) technology. The key advantage of Silicon Germanium is that it is fundamentally a higher speed silicon process, thereby offering maximum leverage from existing silicon fabrication processes. By doping the silicon (Si) substrate with germanium (Ge), SiGe creates supercharged HBTs that can operate at 65 GHz as compared to 15–25 GHz for best-ofbreed silicon-only processes. With the rapid advancement of epitaxial-layer pseudomorphic SiGe deposition processes, epitaxial-base SiGe heterojunction bipolar transistors have been integrated with main stream advanced CMOS development for wide market acceptance, providing the advantages of SiGe technology for analog and radio frequency (RF) circuitry while maintaining the full utilization of the advanced CMOS technology base for digital logic circuitry.

FIG. 1 is a diagram showing a structure of SiGe hetero-junction bipolar transistor. It includes a silicon substrate 11, p doped region 12, n+ doped region 13 (buried collector), n well 14, n+ doped region 16 (collector), shallow trench isolation layers 151~153, p doped SiGe layer 171, isolation layer 18, n doped poly-silicon layer 172, and contact plugs C, E and B. The junctions of the transistor are formed by the n well 14, p doped SiGe layer 171 and n doped poly-silicon layer 172.

SiGe hetero-junction bipolar transistor devices are replacing silicon bipolar junction devices as the primary element in all analog applications. With increased volume and growth in the applications that use SiGe hetero-junction bipolar transistors for external circuitry, ESD robustness is needed. This is especially the case in RF applications such as mobile phone use, where high-transistor speeds and high-frequency responses are needed. As the frequency responses of such devices increase, the loading effect on the transistor, which may lead to excessive noise and distortion, also increases.

FIG. 2A is a diagram showing a conventional silicon controlled rectifier for Si process used for ESD protection, which is disclosed in IEDM 1995, p.337. It includes a silicon substrate 21, p doped region 22, n+ doped region 23 (buried layer), n well 24, n+ doped region 261, shallow trench isolation layers 251~254, p+ doped regions 262 and 264, p doped region 264, n+ doped region 265, poly-silicon layer 27, and contact plugs B1, E1, E2 and C1. The p doped region 262 and n well 24 form a PN junction, the n well 24 and p doped region 263 form a NP junction, and the p doped region 263 and n doped region 265 form another PN junction. The PNPN silicon controlled rectifier is thus formed by theses junctions. The n doped region 261 is coupled to a pad 301, the p doped region 262 is coupled to a pad 302, the n doped region 265 and p doped region 264 are commonly coupled to ground, and a resistor R is coupled between the p doped region 262 and n doped region 261.

FIG. 2B is a diagram showing an equivalent circuit of the silicon controlled rectifier shown in FIG. 2A. It includes two bipolar junction transistors M1 and M2, a resistor R, a resistor R1 formed by the n well 24, a resistor R2 formed by the p doped region 262, a resistor R3 formed by the buried layer 23, and a resistor R4 formed by the p doped region 264. The emitter, base and collector of the transistor M1 are respectively coupled to the pad 301, the resistor R2 and ground. The emitter, base and collector of the transistor M2 are respectively coupled to ground, the resistor R4 and R3. Thus, ESD paths may be provided between the pad 301, 302 and ground.

Theoretically, the structure in FIG. 2A may be applied to that shown in FIG. 1 for a SiGe hetero-junction SCR. However, such an SCR structure has to be improved since the resistor R and the doped region 261 are necessary, which is disadvantageous to circuit size and complicates the process.

SUMMARY OF THE INVENTION

The object of the present invention is to provide an SCR for SiGe process without the additional resistor and doped region used in the conventional SCR.

The present invention provides a silicon controlled rectifier for SiGe process. The silicon controlled rectifier comprises a substrate, a buried layer of a first conductivity type in the substrate, a well of the first conductivity type in the substrate and above the buried layer, a doped region of a second conductivity type in the well, a first conducting layer of the second conductivity type on the substrate, and a second conducting layer of the first conductivity type on the first conducting layer.

The present invention further provides a method for manufacturing a silicon controlled rectifier for SiGe process. The method comprises the steps of providing a substrate, forming a buried layer of a first conductivity type in the substrate, forming a well of the first conductivity type in the substrate and above the buried layer, forming a doped region of a second conductivity type in the well, forming a first conducting layer of the second conductivity type on the substrate, and forming a second conducting layer of the first conductivity type on the first conducting layer.

The present invention further provides an integrated circuit comprising a core circuit; and an ESD protection device protecting the core circuit from ESD damages. The ESD protection device includes a substrate, a buried layer of a first conductivity type in the substrate, a well of the first conductivity type in the substrate and above the buried layer, a doped region of a second conductivity type in the well, a first conducting layer of the second conductivity type on the substrate, and a second conducting layer of the first conductivity type on the first conducting layer.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

FIGS. 3A~3H are cross-section views showing a method for manufacturing an SCR for SiGe process according to one embodiment of the invention.

Figure 1:
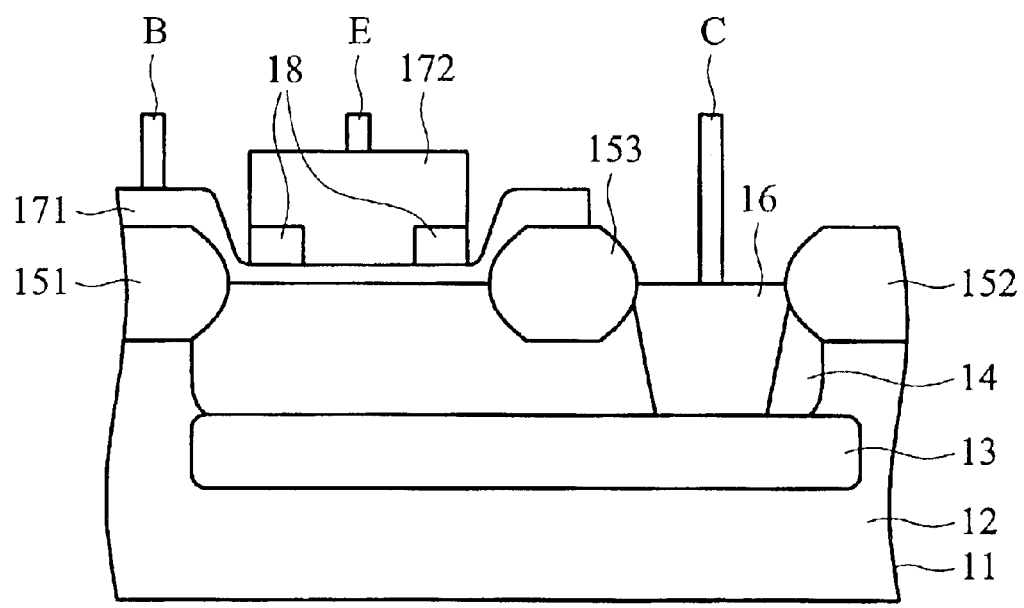
FIG. 1 is a diagram showing a structure of SiGe heterojunction bipolar transistor.
Figure 2A:
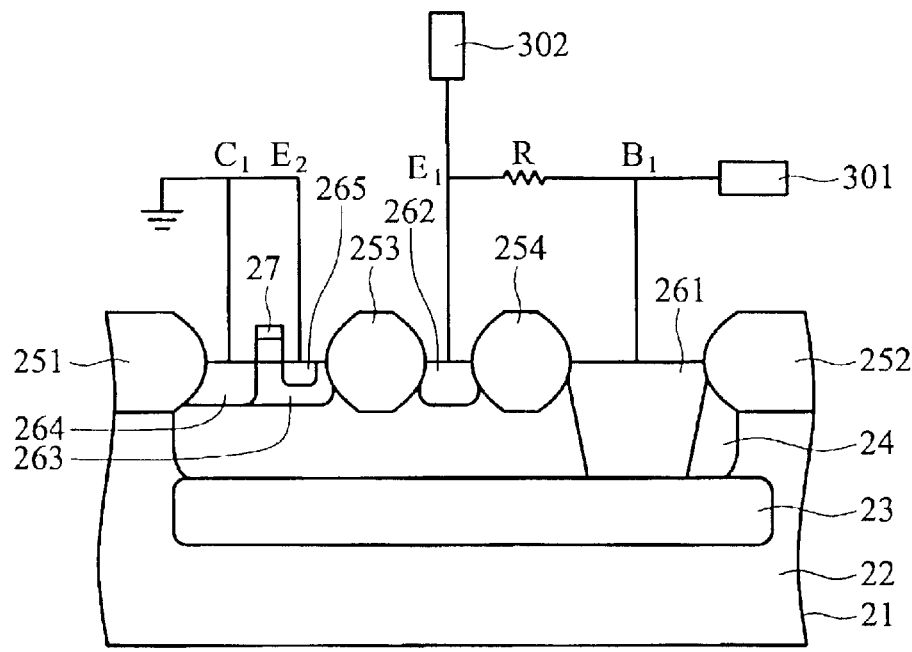
FIG. 2A is a diagram showing a conventional silicon controlled rectifier for Si process used for ESD protection.
Figure 2B:
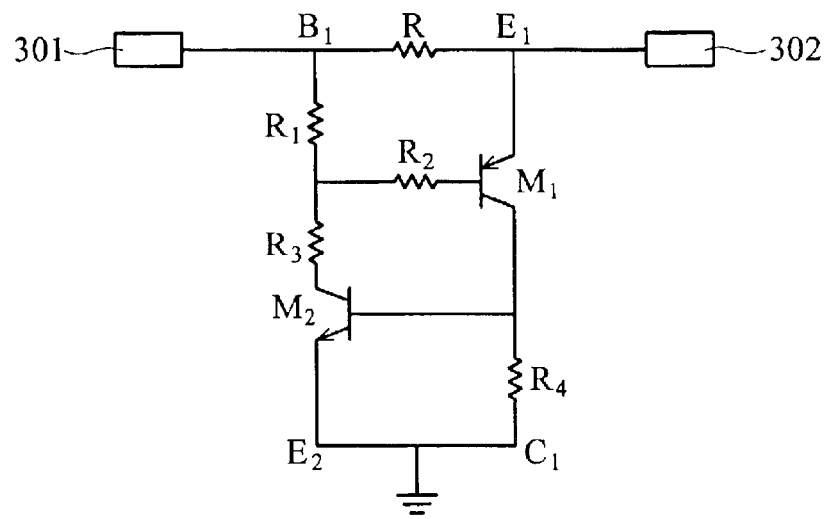
FIG. 2B is a diagram showing an equivalent circuit of the silicon controlled rectifier shown in FIG. 2A.
Figure 3A:
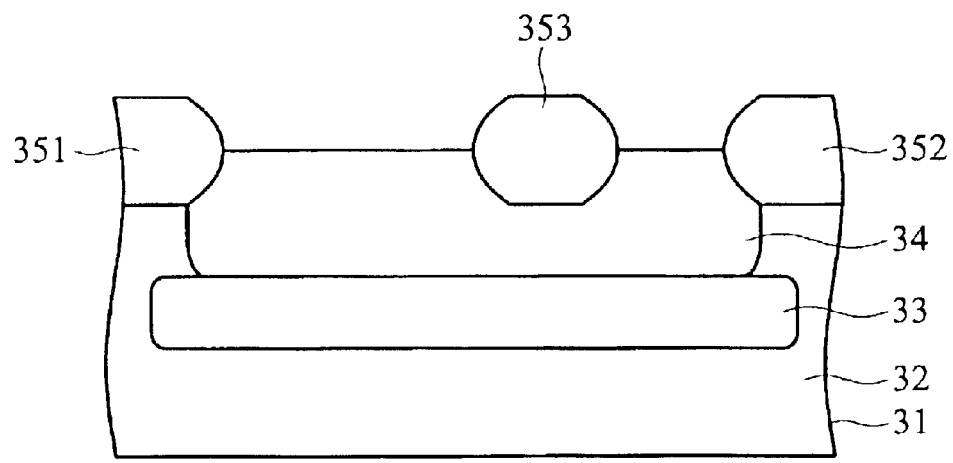
FIGS. 3A~3H are cross-section views showing a method for manufacturing an SCR for SiGe process according to one embodiment of the invention.

As shown in FIG. 3A, a silicon substrate 31 is provided. The silicon substrate 31 has a p doped region 32, an n+ doped region 33, an n doped region 34 above the n doped region 33, isolation layers 351~353 located on two sides of and within the n doped region 34. The isolation layers 351~353 are commonly known as field oxides or STI. The field oxide is typically grown in a diffusion furnace by oxygen flow in a high temperature environment, as is well known in the art. Throughout the present description, it is to be understood that n doping refers to light doping with a group VA element, including N, P, As, Sb, and Bi; and that n+ doping refers to heavy doping with an n dopant. It is further understood that p doping refers to light doping with a Group IIIA element, including B, Al, Ga, In, and Tl; and that p+ doping refers to heavy doping with a p dopant. It is further understood, as is known in the art, that the higher the net doping content, the lower the resistance of the silicon material. The p doped region 32 in the substrate 31 forms the lower part of the substrate. The n+ doped region 33 is commonly referred to as the buried collector region. The n doped region 34 is commonly referred to as the n well, forms a portion of the upper surface of substrate 31 and further covers a portion of the n+ doped region 33.

Figure 3B:
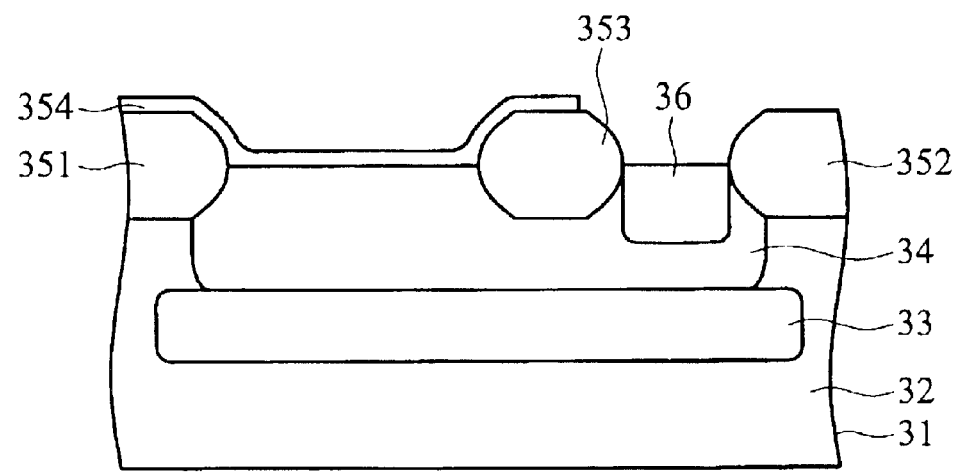

As shown in FIG. 3B, a p+ doped region 36 is formed in the n well 34 and an oxide layer 354 is also formed on the entire surface of substrate 31, and field oxides 351 and 353, typically using chemical vapor deposition (CVD) technology. The oxide layer 354 should be thick enough to isolate between devices, and is typically at least 2000 Å thick.

Figure 3C:
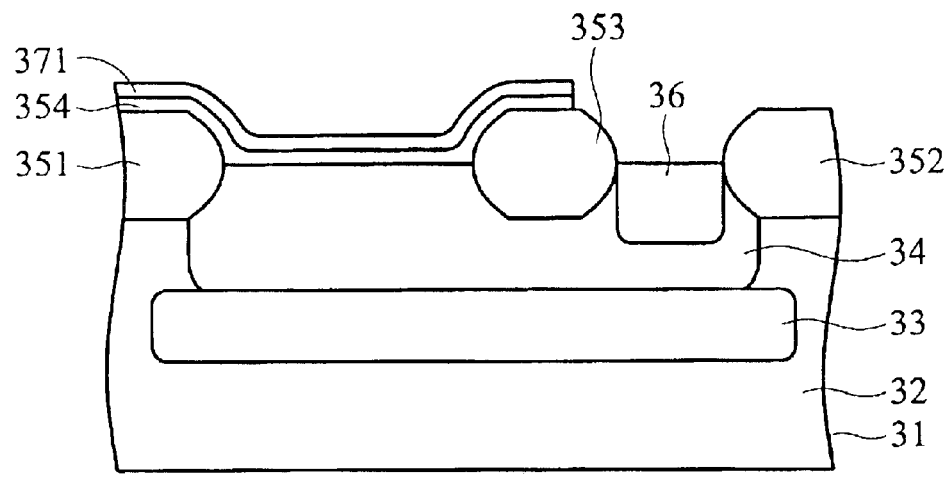

As shown in FIG. 3C, a p+ doped poly-silicon 371 is deposited onto the surface of the oxide layer 354 on substrate 31. The p+ doped poly-silicon layer 371 may be applied by standard low pressure CVD, typically conducted around 800° C. The thickness of p+ doped poly-silicon layer 371 depends on the size of the emitter, and by way of example, may be on the order of 1500 Å for a device having 0.3 μm emitter opening.

Figure 3D:
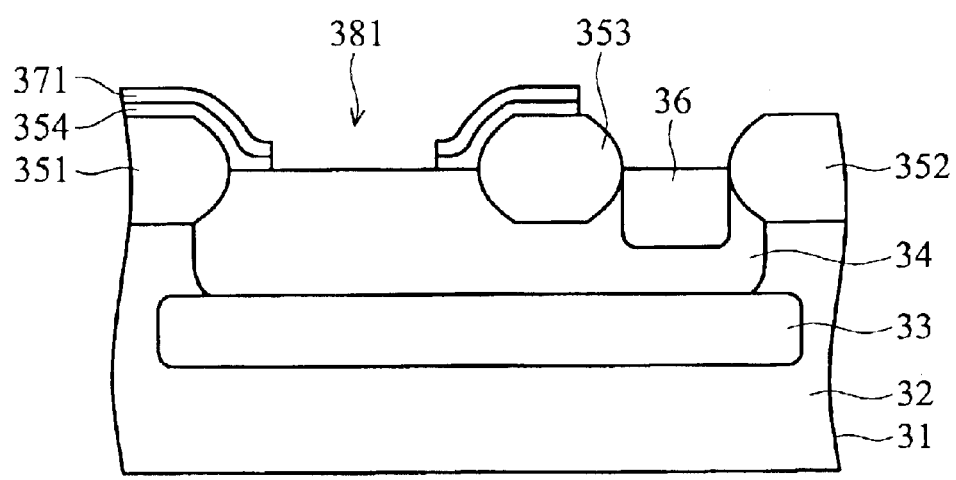

Depicted in FIG. 3D is the formation of a window 381 which is patterned and etched to expose the n doped region 34 of substrate 31. To this end, a portion of p+ doped poly-silicon layer 371 and oxide layer 354 is removed by lithographic technology and by etching technology to form an opening or window 381. The lithographic technique commonly uses a photo-resist mask (not shown), which is removed after the etching is performed. The etching technique is typically an ion etching or reactive ion etching using a plasma. The removal of layers 371 and 354 typically require different chemistries, so etching is a two-step process for the sequential removal of each layer, and these two processes may be performed in the same or in different machines.

Figure 3E:
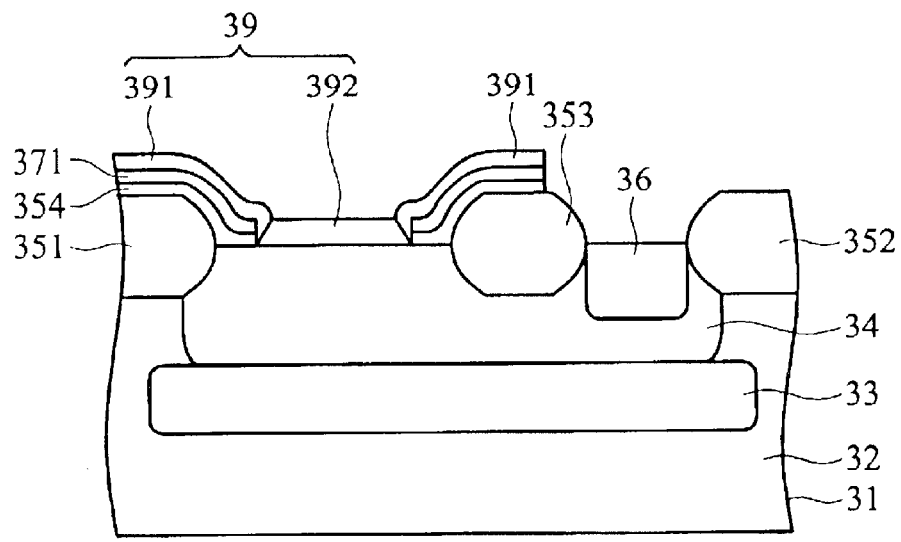

Following formation of the window 381, deposition of an epitaxial layer 39 is performed, with the resulting structure depicted in FIG. 3E. The layer 39 has two potions. One is an epitaxial layer of p doped epi-SiGe 392 formed on the n doped region 34 of substrate 31, and the other is an epitaxial layer of p doped poly-SiGe 391 formed over the p+ doped poly-silicon layer 371. It is to be understood that epitaxial deposition refers to the oriented growth of one crystalline substance upon the surface of another crystalline substance. Within the window 381, the epi-SiGe layer 392 is a single crystal grown in the same crystal orientation of the single crystal substrate upon which it is deposited. The poly-SiGe layer 391 refers to a polycrystalline structure of SiGe grown on the heavily p doped poly-silicon layer 371. The p doped poly-SiGe layer 391 immediately begins to deposit outside the window 381 by virtue of it being epitaxial deposition, resulting in a uniformly thick layer of p doped poly- and epi-SiGe across the surfaces of the heavily doped poly-silicon layer 371 and within the window 381. Again, the thickness of the epitaxial layers 391 and 392 are dependent upon the size of the emitter. By way of example only, the thickness may be on the order of 1200–4000 Å, and may be about 1800 Å for a 0.3 μm emitter opening device. Without the p+ doped poly-silicon layer 371, poly-SiGe growth would have to occur on the oxide layer 354, and would consequently begin more slowly than the growth within the device window 381, thus resulting in a thinner layer of poly-SiGe 391 over the oxide 354 than the epi-SiGe layer 392 in the window 381. The thicker the composite of poly-silicon layer 371 and poly-SiGe layer 391, the lower its resistance, which low resistance is essential for high performance bipolar transistors.

Figure 3F:
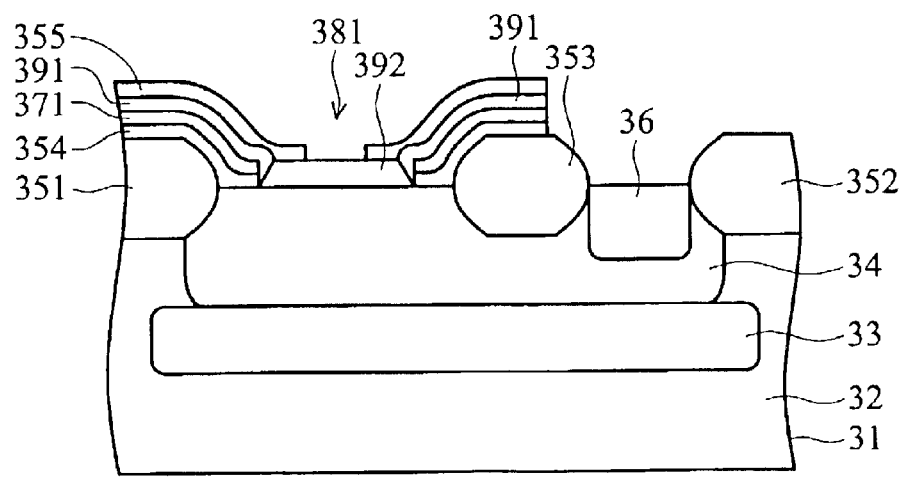

As shown in FIG. 3F, an insulator 355 is formed on the surface of SiGe-containing layer 39 utilizing conventional deposition processes well known in the art. Suitable deposition processes include, but are not limited to: CVD, plasma-enhanced CVD, sputtering, chemical solution deposition and other like deposition processes. The insulator 355 may comprise a single insulator material, or it may include combinations of more than one insulator material, e.g., a dielectric stack. The insulator used in this step of the present invention thus may comprise an oxide, a nitride, oxynitride or combinations thereof, the opening is formed utilizing conventional lithography and etching such as RIE (reactive-ion etching).

Figure 3G:
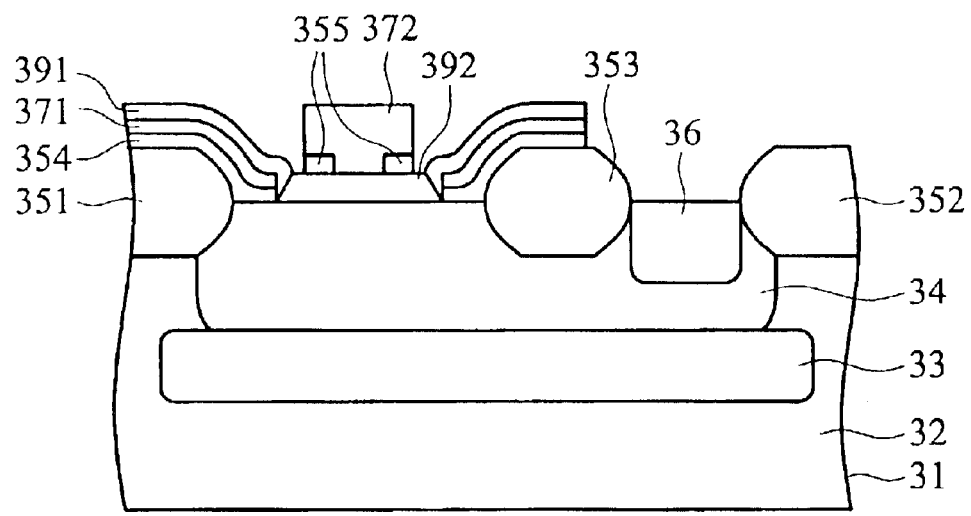

As shown in FIG. 3G, an emitter composed of insulator 355 and n doped poly-silicon layer 372 is formed. The n doped poly-silicon layer 372 is deposited on the insulator 355 utilizing any conventional in-situ doping deposition process that is well known in the art. The doped poly-silicon layer 372 and insulator 355 are patterned using conventional lithography and etching forming the patterned emitter. The etching step may remove both the doped poly-silicon 372 and insulator 355 at the same time or multiple etching steps may be employed in which the doped poly-silicon 372 is selectively etched and thereafter the insulator 355 is selectively etched. Note that after etching, some portions of the underlying SiGe-containing layer 392 are exposed.

Figure 3H:
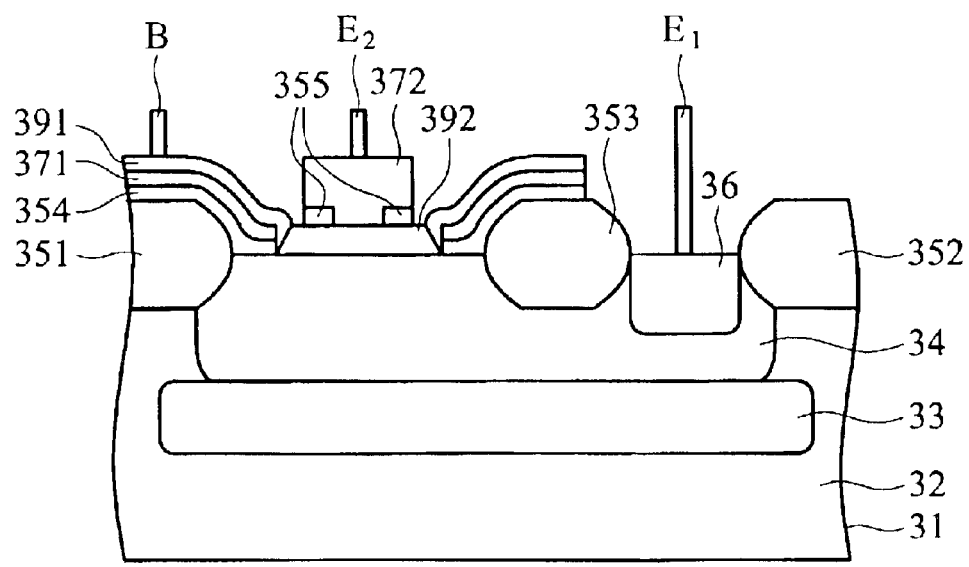

As shown in FIG. 3H, contact plugs E1, E2 and B are respectively formed on the p doped region 36, poly-silicon layer 372 and SiGe layer 391.

Figure 4A:
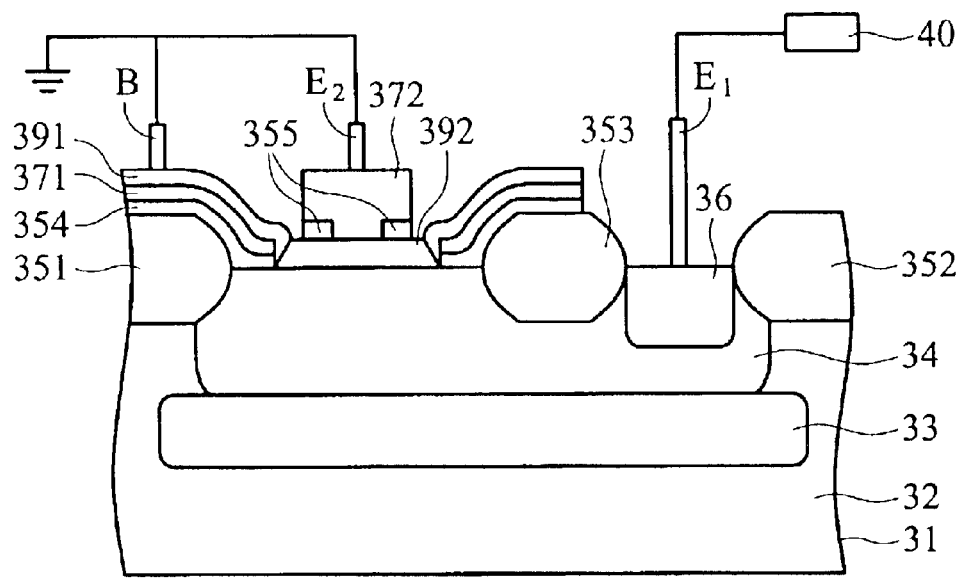
FIG. 4A is a diagram showing an SCR for SiGe process according to one embodiment of the invention.

FIG. 4A is a diagram showing an SCR for SiGe process according to one embodiment of the invention. It includes a silicon substrate 31, p doped region 32, n+ doped region 33 (buried layer), n well 34, shallow trench isolation layers 351~353, p doped regions 36, p doped poly-silicon layer 371, n doped poly-silicon layer 372, p doped SiGe layer 391 and 392, contact plugs E1, E2 and B, and pad 40. The buried layer 33 is disposed in the substrate 31. The n well 34 is in the substrate 31 and above the buried layer 33. The p doped region 36 is located in the n well 34. The p doped SiGe layers 391 and 392 are formed on the substrate 31 and form a PN junction with the n well 34. The n doped poly-silicon layer 372 is formed on the SiGe layer 392 and a NP junction is thus formed therebetween. The STI 351~353 are respectively located on two sides of the n well 34, and between the n well 34 and p doped region 36. The insulator 355 is disposed in the n doped poly-silicon layer 372 and adjacent to the p doped SiGe layer 392. The contact plugs E1, E2 and B are respectively coupled to the p doped region 36, n doped poly-silicon 372 and p doped SiGe layer 391. The pad 40 is coupled to the contact plug E1 while the contact plugs E2 and B are coupled to ground.

Figure 4B:
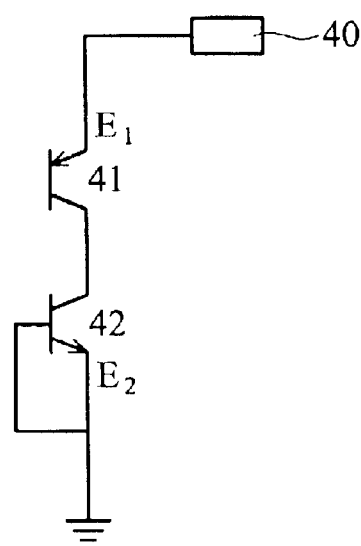
FIG. 4B is a diagram showing an equivalent circuit of the SCR shown in FIG. 4A.

FIG. 4B is a diagram showing an equivalent circuit of the silicon controlled rectifier shown in FIG. 4A. The p doped region 36 and n well 34 form a PN junction, the n well 34 and p doped SiGe layer 392 form a NP junction, and the p doped SiGe layer 392 and n doped poly-silicon 372 form another PN junction. The PNPN silicon controlled rectifier is thus formed by theses junctions. The equivalent circuit includes two bipolar junction transistors 41 and 42 with collectors connected to each other. The emitter E1 of the transistor 41 is coupled to the pad 40. The base B and emitter E2 of the transistor 42 are coupled to ground. The base of the transistor 41, which is formed by the n well 34, is not connected. Accordingly, the equivalent circuit may be regarded as an open-base SCR.

According to simulation results, the trigger voltage of the SCR in the present invention is about 11 volts while that of the conventional SCR with the resistor R having a resistance of 0 Ω is 16 volts. The SCR of the present invention has a lower trigger voltage and is better in ESD protection.

Figure 5:
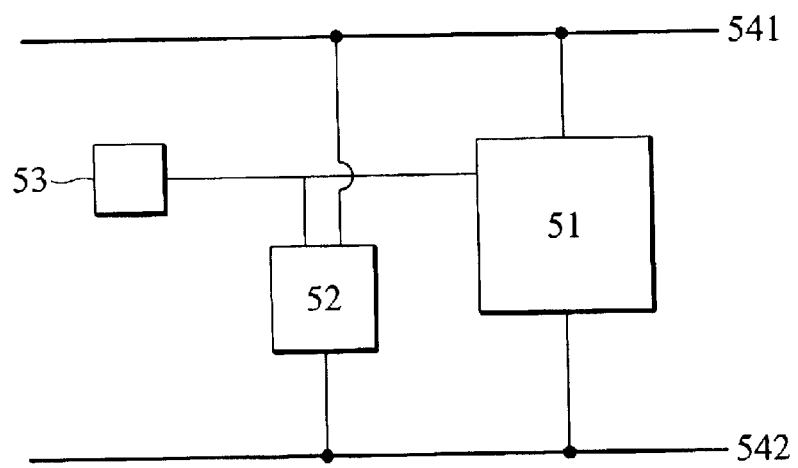
FIG. 5 is a diagram showing an integrated circuit according to one embodiment of the invention.

FIG. 5 is a diagram showing an integrated circuit according to one embodiment of the invention. The integrated circuit includes a core circuit 51 and an ESD protection device 52 protecting the core circuit 51 from ESD damages. The ESD protection device is the silicon controlled rectifier shown in FIG. 4A. It provides ESD paths for the core circuit 51 when the ESD pulse zaps the I/O pad 53, or power lines 541 and 542.

In conclusion, the present invention provides an SCR for SiGe process without the additional resistor and doped region used in the conventional SCR. A p doped region replaces the collector region in the conventional SCR and an SiGe layer is formed on the substrate to construct a NPN hetero-junction. Thus-formed PNPN SCR takes all the advantages of SiGe process and needs no additional resistor and doped region.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A silicon controlled rectifier for SiGe process comprising:
   a substrate;
   a buried layer of a first conductivity type in the substrate;
   a well of the first conductivity type in the substrate and above the buried layer;
   a doped region of a second conductivity type in the well;
   a first conducting layer of the second conductivity type on the substrate; and
   a second conducting layer of the first conductivity type on the first conducting layer.

2. The silicon controlled rectifier as claimed in claim 1 further comprising:
   a plurality of first isolation layers respectively disposed on two sides of the well, and between the well and the doped region; and
   a plurality of second isolation layers in the second conducting layer adjacent to the first conducting layer.

3. The silicon controlled rectifier as claimed in claim 1, wherein the first isolation layers are shallow trench isolation layers.

4. The silicon controlled rectifier as claimed in claim 1 further comprising a first, second and third contact plugs respectively coupled to the doped region, second conducting layer and first conducting layer.

5. The silicon controlled rectifier as claimed in claim 4 further comprising a pad, wherein the first contact plug is coupled to the pad, the second and third contact plug are coupled to receive a voltage level.

6. The silicon controlled rectifier as claimed in claim 1, wherein the substrate is of the second conductivity type.

7. The silicon controlled rectifier as claimed in claim 1, wherein the first and second conductivity type are N and P type respectively.

8. The silicon controlled rectifier as claimed in claim 1, wherein the first conducting layer is made of SiGe.

9. The silicon controlled rectifier as claimed in claim 1, wherein the second conducting layer is made of poly-silicon.

10. A method for manufacturing a silicon controlled rectifier for SiGe process comprising the steps of:

providing a substrate;

forming a buried layer of a first conductivity type in the substrate;

forming a well of the first conductivity type in the substrate and above the buried layer;

forming a doped region of a second conductivity type in the well;

forming a first conducting layer of the second conductivity type on the substrate; and forming a second conducting layer of the first conductivity type on the first conducting layer.

11. The method as claimed in claim 10 further comprising the steps of:

forming a plurality of first isolation layers respectively on two sides of the well, and between the well and the doped region; and forming a plurality of second isolation layers in the second conducting layer and adjacent to the first conducting layer.

12. The method as claimed in claim 10 further comprising the step of forming a first, second and third contact plugs respectively coupled to the doped region, second conducting layer and first conducting layer.

13. The method as claimed in claim 10, wherein the substrate is of the second conductivity type.

14. The method as claimed in claim 10, wherein the first and second conductivity type are N and P type respectively.

15. The method as claimed in claim 10, wherein the first conducting layer is made of SiGe.

16. The method as claimed in claim 10, wherein the second conducting layer is made of poly-silicon.

17. An integrated circuit comprising:

a core circuit; and an ESD protection device protecting the core circuit from ESD damages, comprising:

a substrate;

a buried layer of a first conductivity type in the substrate;

a well of the first conductivity type in the substrate and above the buried layer;

a doped region of a second conductivity type in the well;

a first conducting layer of the second conductivity type on the substrate; and a second conducting layer of the first conductivity type on the first conducting layer.

18. The integrated circuit as claimed in claim 17, wherein the ESD protection device further comprises:

a plurality of first isolation layers respectively disposed on two sides of the well, and between the well and the doped region; and a plurality of second isolation layers in the second conducting layer adjacent to the first conducting layer.

19. The integrated circuit as claimed in claim 17, wherein the first isolation layers are shallow trench isolation layers.

20. The integrated circuit as claimed in claim 17, wherein the ESD protection device further comprises a first, second and third contact plugs respectively coupled to the doped region, second conducting layer and first conducting layer.

21. The integrated circuit as claimed in claim 20, wherein the ESD protection device further comprises a pad, wherein the first contact plug is coupled to the pad, the second and third contact plug are coupled to receive a voltage level.

22. The integrated circuit as claimed in claim 17, wherein the substrate is of the second conductivity type.

23. The integrated circuit as claimed in claim 17, wherein the first and second conductivity type are N and P type respectively.

24. The integrated circuit as claimed in claim 17, wherein the first conducting layer is made of SiGe.

25. The integrated circuit as claimed in claim 17, wherein the second conducting layer is made of poly-silicon.

* * * * *